US009237646B2

(12) United States Patent
Yuen et al.

(10) Patent No.: US 9,237,646 B2
(45) Date of Patent: Jan. 12, 2016

(54) ELECTRICAL AND THERMAL CONDUCTIVE THIN FILM WITH DOUBLE LAYER STRUCTURE PROVIDED AS A ONE-DIMENSIONAL NANOMATERIAL NETWORK WITH GRAPHENE/GRAPHENE OXIDE COATING

(71) Applicant: THE HONG KONG UNIVERSITY OF SCIENCE AND TECHNOLOGY, Kowloon, Hong Kong (CN)

(72) Inventors: Matthew Ming Fai Yuen, Hong Kong (CN); Xinfeng Zhang, Hong Kong (CN); Wayman Ngai Man Wong, Hong Kong (HK)

(73) Assignee: The Hong Kong University of Science and Technology, Kowloon (HK)

( * ) Notice: Subject to any disclaimer, the term of this patent is extended or adjusted under 35 U.S.C. 154(b) by 203 days.

(21) Appl. No.: 13/891,913

(22) Filed: May 10, 2013

(65) Prior Publication Data
US 2013/0299217 A1 Nov. 14, 2013

Related U.S. Application Data

(60) Provisional application No. 61/688,417, filed on May 14, 2012.

(51) Int. Cl.
*H05K 1/09* (2006.01)
*H05K 3/10* (2006.01)
*B82Y 99/00* (2011.01)
*B82Y 30/00* (2011.01)

(52) U.S. Cl.
CPC .................. *H05K 1/097* (2013.01); *H05K 1/09* (2013.01); *H05K 3/10* (2013.01); *B82Y 30/00* (2013.01); *B82Y 99/00* (2013.01); *H05K 2201/0338* (2013.01)

(58) Field of Classification Search
CPC ................................ H05K 1/097; H05K 3/10
USPC ........................... 174/257; 427/97.1; 977/932
See application file for complete search history.

(56) References Cited

U.S. PATENT DOCUMENTS

| 6,159,620 | A * | 12/2000 | Heath et al. ................... 428/615 |
| 8,030,186 | B2 * | 10/2011 | Romano et al. ................ 438/478 |
| 2009/0320911 | A1 * | 12/2009 | Ruoff .............................. 136/252 |
| 2011/0037033 | A1 * | 2/2011 | Green et al. .................... 252/510 |
| 2011/0070146 | A1 | 3/2011 | Song et al. |
| 2011/0088770 | A1 | 4/2011 | Allemand et al. |
| 2011/0268647 | A1 * | 11/2011 | Ivanovici et al. .............. 423/448 |
| 2012/0001130 | A1 * | 1/2012 | Yu et al. ......................... 252/513 |
| 2012/0298170 | A1 * | 11/2012 | Lee et al. ....................... 136/244 |
| 2013/0048339 | A1 * | 2/2013 | Tour et al. .................. 174/126.1 |
| 2013/0264041 | A1 * | 10/2013 | Zhamu et al. .................. 165/185 |

FOREIGN PATENT DOCUMENTS

| CN | 102208542 | A | 10/2011 | |
| KR | 101296809 | * | 8/2013 | ............... H01B 1/04 |

OTHER PUBLICATIONS

Derwent No. 2011-D77585, .pdf reference to TW 201022901 A, Inventor Huang C., published Jun. 16, 2010.*
Derwent No. 2001-101560, .pdf reference to U.S. Pat. No. 6,159,620, Inventor Heath et al., published Dec. 12, 2000.*
Madaria, A.R., et al. "Uniform, Highly Conductive, and Patterned Transparent Films of a Percolating Silver Nanowire Network on Rigid and Flexible Substrates Using a Dry Transfer Technique", Nano Res. 3: pp. 564-573, (2010).
Lee, Jung-Yong, et al. "Solution-Processed Metal Nanowire Mesh Transparent Electrodes", Nano Letters, vol. 8, No. 2, pp. 689-692, (2008).
Liu, Cai-Hong, et al., "Silver nanowire-based transparent, flexible, and conductive thin film", Nanoscale Research Letters, 6:75, 8 pages, (2011).
De, S., et al. "Silver Nanowire Networks as Flexible, Transparent, Conducting Films: Extremely High DC to Optical Conductivity Ratios", www.acsnano.org, vol. 3, No. 7, pp. 1767-1774, (2009).
Hecht, D.S., et al., "Emerging Transparent Electrodes Based on Thin Films of Carbon Nanotubes, Graphene, and Metallic Nanostructures", Advanced Materials, 23, pp. 1482-1513, (2011).
Kumar, A., et al., "The Race to Replace Tin-Doped Indium Oxide: Which Material will Win?", www.acsnano.com, vol. No. 1, pp. 11-14, (2010).
Hu, L, et al., "Scalable Coating and Properties of Transparent, Flexible, Silver Nanowire Electrodes", www.acsnano.com, vol. 4, No. 5, pp. 2955-2963, (2010).
De, S., et al., "The effects of percolation in nanostructured transparent conductors", MRS Bulletin, vol. 36, pp. 774-781, (Oct. 2011).

* cited by examiner

*Primary Examiner* — Timothy Thompson
*Assistant Examiner* — Charles Pizzuto
(74) *Attorney, Agent, or Firm* — Nath, Goldberg & Meyer; Jerald L. Meyer; Stanley N. Protigal

(57) ABSTRACT

A conductive thin film device includes a substrate and a thin film structure applied to the substrate. The thin film structure is applied as a first layer and forms a one-dimensional nanomaterial networked layer deposited on the substrate. A coating layer overlays the one-dimensional nanomaterial networked layer and can be made from graphene or graphene oxide. The coating layer at least partially covers the nanomaterial networked layer, thereby forming the device as a double-layer structure.

21 Claims, 6 Drawing Sheets

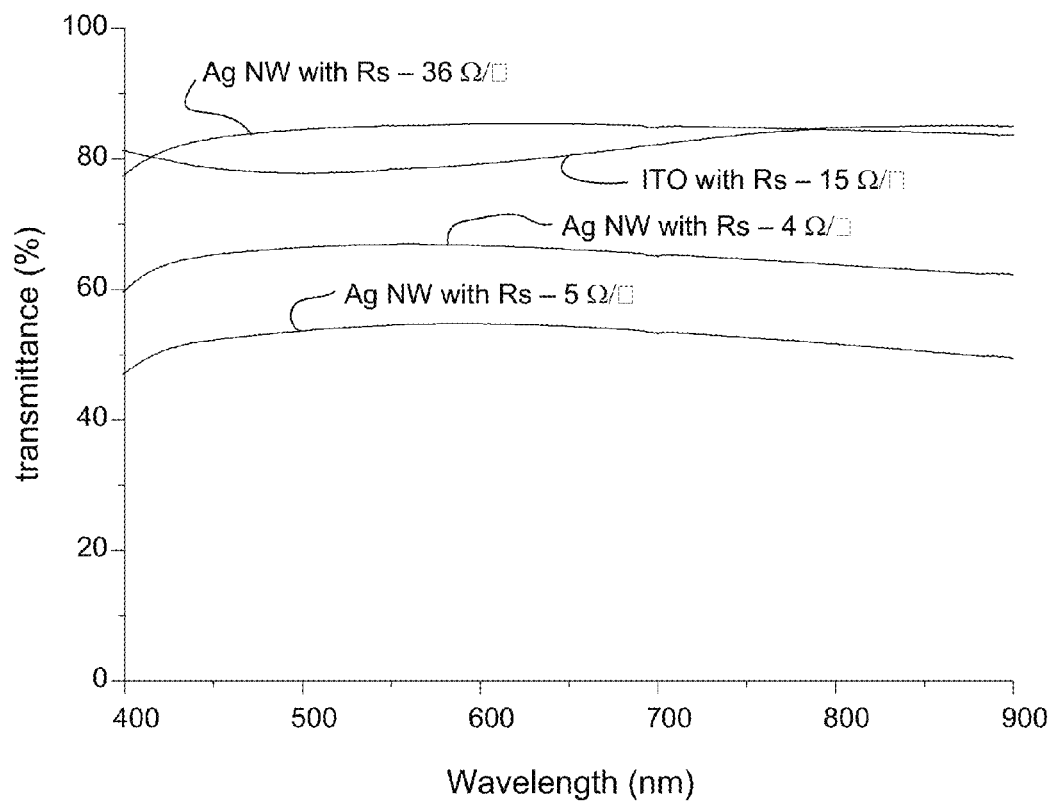
Fig. 4
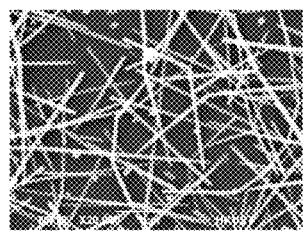 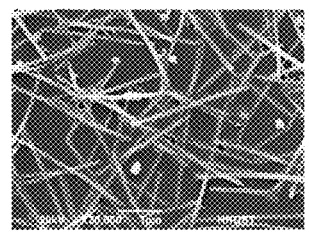
Fig. 5A      Fig. 5B

ELECTRICAL AND THERMAL CONDUCTIVE THIN FILM WITH DOUBLE LAYER STRUCTURE PROVIDED AS A ONE-DIMENSIONAL NANOMATERIAL NETWORK WITH GRAPHENE/GRAPHENE OXIDE COATING

RELATED APPLICATION(S)

The present Patent Application claims priority to Provisional Patent Application No. 61/688,417 filed May 14, 2012, which is assigned to the assignee hereof and filed by the inventors hereof and which is incorporated by reference herein.

BACKGROUND

1. Field

The present disclosure relates to thin films, silver nanowires and graphene oxide. More particularly it relates to flexible thin films with high electrical conductivity formed as one-dimensional nanomaterial networked film, which can be conductive, transparent and flexible.

2. Background

Application of electrically conducting thin films is experiencing a rapid growth with a huge number of commercial products in the market such as liquid crystal displays (LCDs), plasma displays, organic light emitting diodes (OLEDs), flexible displays and solar cells. In any one of these applications, a thin film with high electrical conductivity is always desired. In addition to photonic applications, conductive films exhibiting high degree of thermal conductivity is desirable. Moreover, in flexible display and electronic paper applications, flexibility of the conductive film is a key factor. For solar cells, electroluminescence control elements and touch panels, transparency of the conductive film is a priority.

Conventionally, indium-tin oxide (ITO), which displays high electrical and optical performance, is the most commonly used electrical conductive thin film. These ITO films are usually deposited on a substrate by vacuum deposition or sputtering. Such deposition processes are relatively expensive and the resulting ITO films often cannot be employed in flexible devices due to their brittleness.

SUMMARY

A conductive thin film device is formed as a thin film structure deposited on a substrate as a one-dimensional nanomaterial networked layer deposited on the substrate. A coating layer of graphene and/or graphene oxide is applied to the one-dimensional nanomaterial networked layer and overlays the one-dimensional nanomaterial networked layer. The coating layer at least partially covers the nanomaterial networked layer, thereby forming the device as a double-layer structure.

BRIEF DESCRIPTION OF THE DRAWINGS

FIG. 2A is a scanning electron microscopy image showing silver nanowire (Ag NW) network without a graphene oxide (GO) coating. FIG. 2B is a scanning electron microscopy image GO coating on an image showing an Ag NW network. FIG. 2C is an atomic force microscopy image of the GO coating.

FIG. 4 is a graph illustrating the change of the sheet resistance of graphene oxide (GO) treated A silver nanowire (Ag NW) thin film with different transmittance values.

FIGS. 5A and 5B are scanning electron microscopy images of silver nanowire (Ag NW) thin films. FIG. 5A shows a silver nanowire network and, FIG. 5B shows a silver nanowire network film with graphene oxide (GO) coating.

FIG. 6A shows sheet resistance (Rs) of the bare silver nanowire (Ag NW) electrode and nanowire/graphene oxide (NW/GO) double layer electrode with different transmittance. FIG. 6B shows the results of an enhancement factor, which is a ratio between the Rs before and after graphene oxide (GO) coating of the double layer electrode with different film transmittances.

DETAILED DESCRIPTION

Overview

Figure 1:
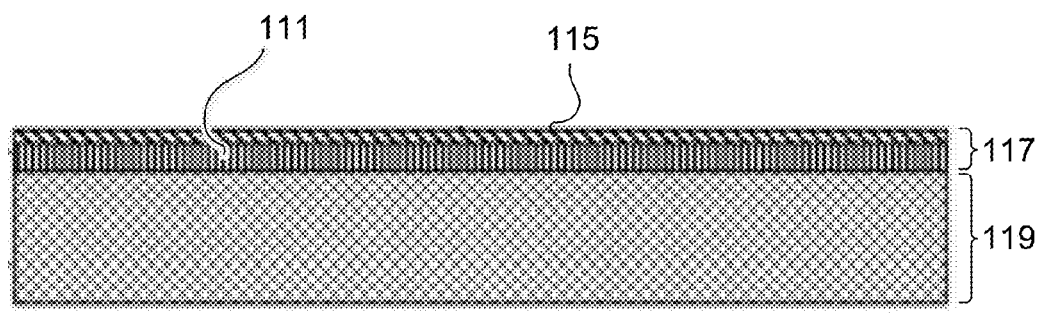
FIG. 1 is a schematic diagram showing a double layer thin film structure in cross-section.

The present subject matter is directed to a thin film that demonstrates excellent electrical performance and optical transparency (depending on substrates), and is capable of providing smoothness in surface and flexibility, and a production method of same. The present disclosure also provides an excellent thermal management solution for light emitting or heat generating applications. Accordingly, an electrical and thermal conductive film with double layer structure is provided as a one-dimensional nanomaterial network with graphene/graphene oxide coating.

In order to cost effectively fabricate flexible conductive thin films with good electrical, thermal, and optical performance, a double layer thin film structure is formed by a coating or printing method. The thin films have electrical conductivity and optical transparency comparable to those of commercial ITO, and additionally possess excellent flexibility and thermal conductivity.

Development of new generations of transparent/flexible transparent electrodes have attracted great attention due to the rapid growing demands in modern optoelectrical devices, such as liquid-crystal displays (LCDs), touch panels, e-paper, organic light-emitting diodes (OLEOs), and solar cells. Conventionally, indium-doped tin oxide (ITO) is the most commonly used as Transparent Conductive Electrode (TCE) because of its high electrical conductivity and high optical transparency. There are many drawbacks in the case of ITO electrodes such as weak mechanical strength, high processing temperature and high fabrication cost. Carbon nanotube, graphene, and metal nanowire thin films have been proposed as viable replacements for traditional indium tin oxide (ITO) film.

Among those materials, silver nanowire (Ag NW) is one of the most promising candidates due to its superior optoelectrical properties. Solution-processable Ag NW film can be made in large quantities. Thin film produced from a solution process requires additional harsh treatments to achieve high electrical conductivity. Such harsh treatments include high-temperature (>150° C.) or long-time thermal annealing, applying extra pressure, vacuum filtration, and hydrochloric acid (HCl) vapor treatment, etc. Those harsh treatments complicate the process, and are likely to damage the substrates or devices. Additionally, the mechanical, thermal, and chemical durability of Ag NW based film is often unsatisfactory, and hinders its practical application.

A double layer structured transparent/flexible transparent electrode is formed from an Ag NW network film with a graphene or graphene oxide (GO) coating. The electrode includes two layers on top of a transparent substrate successively. The first layer is a thin film composed of Ag NW networks, and a GO coating is applied on top. The top encapsulation layer not only greatly decreases the film resistivity while keeping its transparency, but also enhances the thermal and chemical stability. The resulting structure is a Ag NW/GO double layered electrode.

While the electrode in the non-limiting example configuration is transparent to visible light, it is also possible to provide an electrode which is transparent or semi-transparent to ultraviolet (UV) or infrared (IR) light, either with or without transparency to visible light. The transmittance value of the substrate and the thin film layer with the graphene or GO coating can vary and may be applied to visible or non-visible light (e.g., IR or UV), according to the intended application.

In the case of providing a transparent electrode, the substrate may be formed of material which exhibits transparency similar to that desired for the electrode. The substrate may be formed of non-transparent materials if transparency of the substrate is not required. The substrate may, by way of non-limiting examples, be polymer, ceramic, glass, semiconductor, metal, metal oxide, non-metal oxide, composite material surface or another material suitable for thin film coating The substrate may also be formed as an electronic device, such as (as non-limiting examples) a display, an LED or LED array or photosensor.

The disclosed electrical and thermal conductive nanowire film is based on a double layer structure. The double layer structure, comprises a one-dimensional nanomaterial networked film covered by a graphene/graphene oxide coating layer, wherein the thickness of the networked film is tens of nanometer to few micrometers, and the thickness of the coating layer varies from 1 nm to 50 nm.

FIG. 1 is a diagram showing, in cross-section, a structure of double layer transparent electrode including a first silver nanowire film, and a second graphene oxide coating on a substrate, forming a double layer thin film structure.

One technique for forming these flexible conductive thin films employs a one-dimensional nanomaterial networked film 111 such as metal/metal oxide nanowires and carbon nanotube. Networked film 111 is coated with a double layer structure 117 in which the one-dimensional nanomaterial networked layer is fully or partially coated with graphene/graphene oxide layer 115. The double layer structured transparent/flexible transparent electrode is produced from Ag NW network film with GO coating. FIG. 1 illustrates the structure of double layer electrode, which shows a first Ag NW network film and a second GO coating. To make the electrode, a transparent substrate (e.g., glass, PET, etc.) is initially coated with a layer of Ag NW film via drop-casting of its isopropyl alcohol suspensions. The material is then coated with a GO layer by spin-coating a suspension of GO. This double layer electrode enhances the electrical performances without sacrificing optical properties, and also has improved thermal and chemical stability.

It has been found that coating a single layer structure of silver nanowire percolation network, employed as a conductive layer, with a graphene oxide layer forming a double layer structure leads to greatly improved electrical conductivity. The resulting conductive thin film is a 2D surface structure and can function as an electrical conductor and/or as an in-plane thermal conductor. This is a double layer structure of electrical or thermal conductive film made of one-dimensional nanomaterial networked film with graphene or graphene oxide coating. The conductive film includes two layers lying on top of a substrate 119. The first layer composes of a one-dimensional nanomaterial networked film, and the top layer is a graphene or graphene oxide coating. The thickness of the one-dimensional nanomaterial networked film is typically of tens of nanometer to few micrometers. The graphene or graphene oxide coating is from 1 nm to 50 nm.

Production Methods

A solution suspension of silver nanowires was prepared and the solution was then applied on substrate by drop casting. Other known methods in the art, by way of non-limiting example, Meyer rod coating, spin coating, doctoring blade, Langmuir-Blodgett coating, or dip-coating can be used.

After drying, a bare silver nanowire film, also referred as "a single layer structure of silver nanowire percolation network", was formed on the substrate.

Figure 2A:
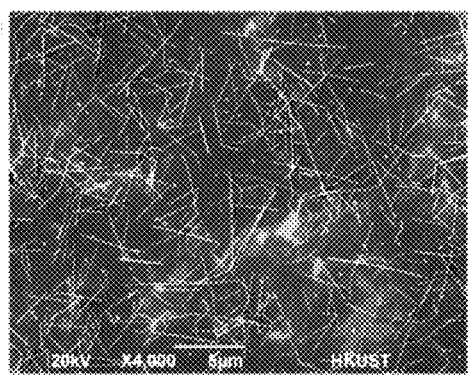
FIGS. 2A-2C are images of silver nanowire networks.
Figure 2B:
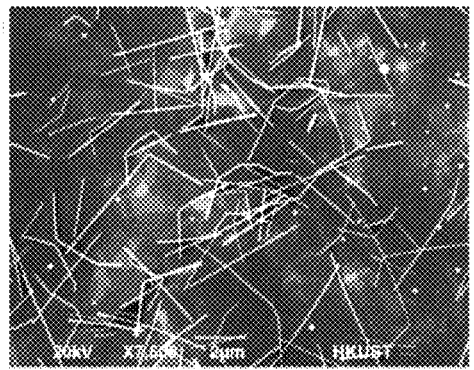
Figure 2C:
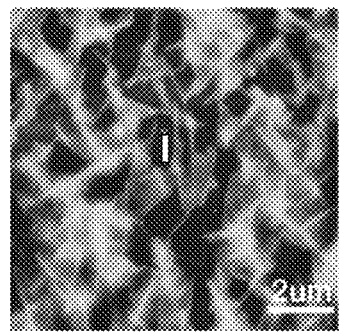

FIGS. 2A-2C are images of silver nanowire networks. FIG. 2A is a scanning electron microscopy image showing silver nanowire network without a GO coating. FIG. 2B is a scanning electron microscopy image GO coating on image showing silver nanowire network. FIG. 2C is an atomic force microscopy image of the GO coating.

The double layer structure is realized by spin-coating of a GO solution on the top of the silver nanowires film. As with the deposition of the silver nanowires, the GO solution may be applied by other known methods in the art, by way of non-limiting example, Langmuir-Blodgett (LB) coating, doctoring blade, or dip-drawing. The double layer structure is composed of a silver nanowire film with an underlying graphene oxide layer formed immediately after evaporation of the solvent.

Figure 3:
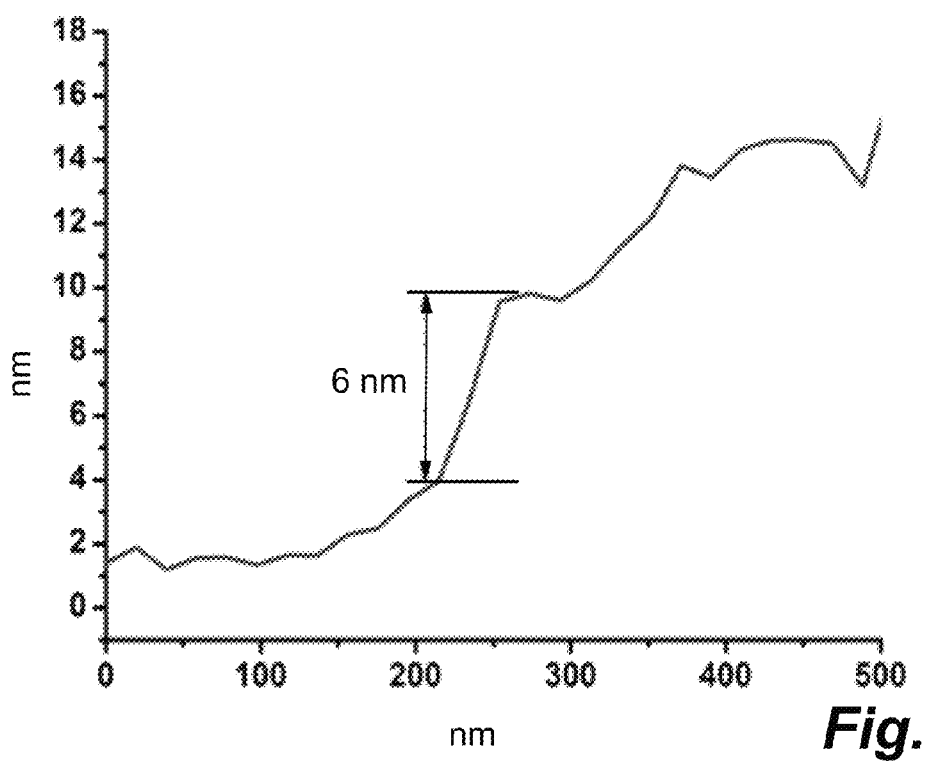
FIG. 3 is a graphical depiction of the silver nanowire networks taken along the dark line of FIG. 2C.

The graphene oxide (GO) coating on silver nanowire networked film was studied by SEM and AFM. It is seen from FIGS. 2A and B that a thin film composed of overlapped GO sheets was laid on the silver nanowire film. The atomic force microscopy image in FIG. 2C further confirmed that the GO layer covered the top of Ag NW films. The thickness of the GO coating from atomic force microscopy cross section measurement is around 6 nm, which is consistent with literature reports. FIG. 3 is a graphical depiction of the silver nanowire networks taken along the dark line of FIG. 2C.

The GO coating method is very simple and fast, without a need for post thermal annealing or chemical treatment; and applicable effectively to a variety of substrates, such as PET, silicone, glass, etc. It is thus expected to be useful in making transparent or flexible transparent electrodes. The optical transmittance and sheet resistance of Ag NW film were measured with UV-Vis spectrometer and four point probe station, and the results as shown in FIG. 4. The sheet resistance of a GO-silver nanowire film with transmittance of 85% (with substrate subtraction) is around 36Ω/□, which is comparable to those reported by thermal annealing method or mechanical methods. While it decreased to 5 and 4Ω/□, respectively, while transmittance decreased to 67% and 55%. Typical transmittance values are expected to range from 50% to 99%.

The transmittance values may be apply to visible or non-visible light (e.g., IR or UV), according to the intended application.

Results

The selection of material for the top encapsulation layer for TCE is quite stringent for the double layered electrode. The prerequisite requirement is that the encapsulation layer should not deteriorate the performance of TCE in terms of light transmittance and electrical conductivity. An ideal material should be a thin transparent film, but in the example configurations, a transparent metal oxide sol-gel oxide film is not used. It is noted, however, that it is possible to provide a graphene or GO encapsulation layer and also apply another encapsulation layer such as transparent metal oxide sol-gel film, used as the top encapsulation layer.

It is well-known that graphene is a one-atom-thick planar sheet of sp2-bonded carbon atoms, which has a very large aspect ratio. The GO is ideally suitable to serve as the encapsulation layer for the two-dimensional electrode. Graphene oxide (GO) has particular advantages over graphene and reduced graphene oxide (rGO) when used in applications where optical transparency in the visible light region is important. Nevertheless, as a practical matter, the difference in film transmittance between GO and rGO is not significant. Therefore, rGO may be substituted for GO as desired.

In addition to the use of the GO as an encapsulation layer, it is possible to provide additional encapsulation layers without departing from the disclosed concepts. As an example, ZnO sol gel may be used as a further encapsulant material.

FIGS. 5A and 5B are scanning electron microscopy images of Ag NW thin films. FIG. 5A shows a silver nanowire network and, FIG. 5B shows a silver nanowire network film with graphene oxide (GO) coating. FIG. 5A compares the SEM images of the Ag NW film before and after GO coating. It is clearly seen from FIG. 5B that after GO coating the Ag NW film was almost fully covered by a thin encapsulation layer. The resulting structure has many holes and voids existing in the encapsulation layer. This is due to the encapsulation layer being composed from thousands of single pieces of GO sheets with irregular shapes and broad size distributions.

Figure 6A:
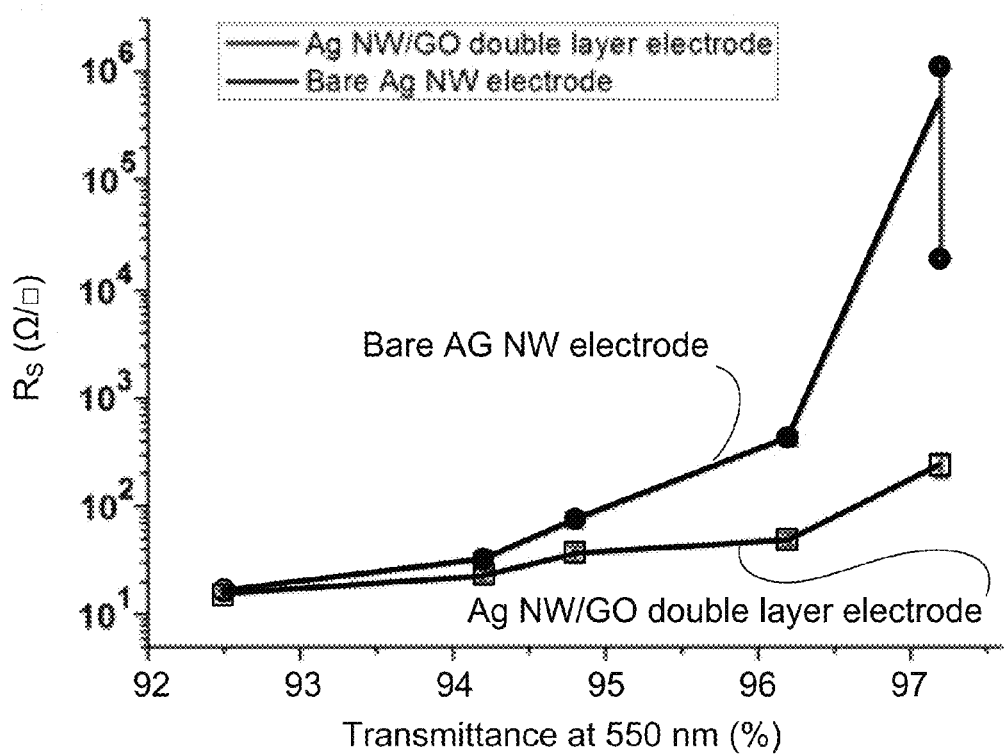
FIGS. 6A and 6B are graphical depictions of sheet resistance.
Figure 6B:
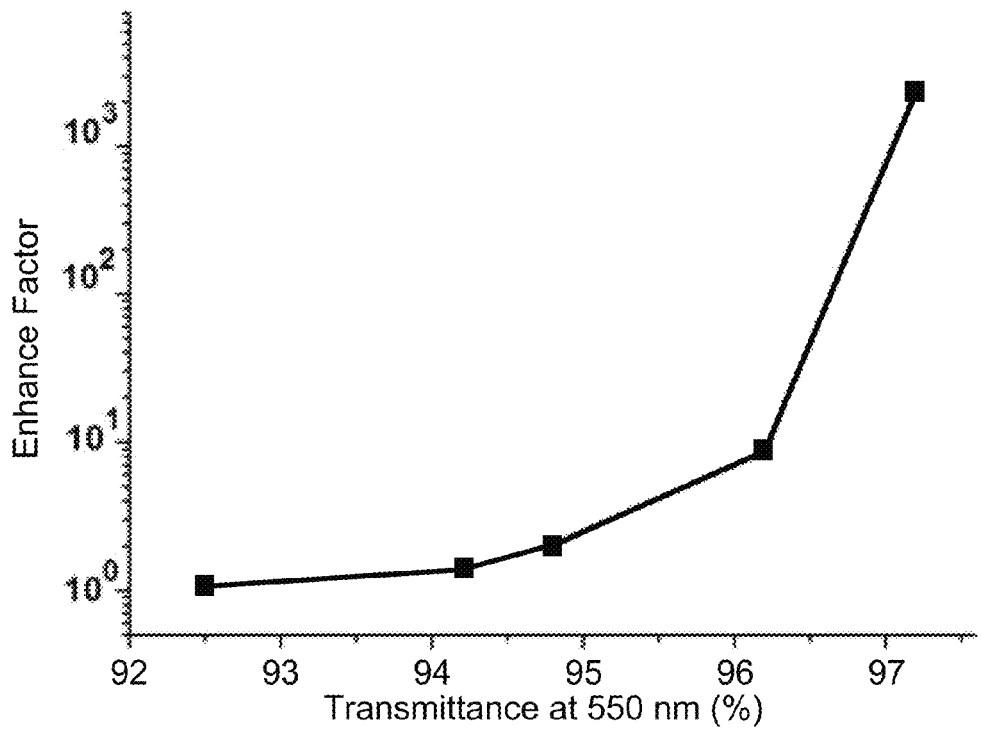

Although GO is almost transparent in visible light region, it is intrinsically electrical insulating due to the presence of large amount of oxygen-containing functional groups. It was desired to ascertain that this non-conductive encapsulation layer would not deteriorate the electrical conductivity. FIGS. 6A and 6B are graphical depictions of sheet resistance. FIG. 6A shows sheet resistance (Rs) of the bare Ag NW electrode and NW/GO double layer electrode with different transmittance. FIG. 6B shows the results of an enhancement factor, which is a ratio between the sheet resistances (Rs) before and after GO coating of the double layer electrode with different film transmittances. FIG. 6A shows the sheet resistance (Rs) of the Ag NW film with various transmittances before and after coated with GO layer. Note that a high film transmittance corresponds to a low density of Ag NW in the electrode. It is clearly shown that the sheet resistance (Rs) of double layered electrode is lower than the bare Ag NW electrode. FIG. 6B shows the enhancement factor (defined by the ratio between the film Rs without and with GO coating) due to the encapsulation layer. Strikingly, the enhancement factor grows exponentially with the increase in the film transmittance. Thus we conclude that GO coating can enhance the electrical conductivity rather than degrade the electrical performance, and is an ideal encapsulation layer for making the double layered electrode.

Ag NW thin film has been shown to have good potential as an alternative Transparent Conductive Electrode (TCE). Thermal stability and chemical stability are of crucial importance in the use of Ag NW thin films in many applications. In many optoelectrical device fabrication processes, thermal treatment is indispensable. Also, the Ag NW electrode might be exposed to various chemicals, such as corrosive electrolyte. The poor chemical and thermal stabilities of those metal nanowires would greatly limit its applications. A well-designed encapsulation layer is likely a good solution to those obstacles. The thermal and chemical stability of GO-coated Ag NW (Ag NW/GO) double layered electrode were investigated.

Figure 7A:
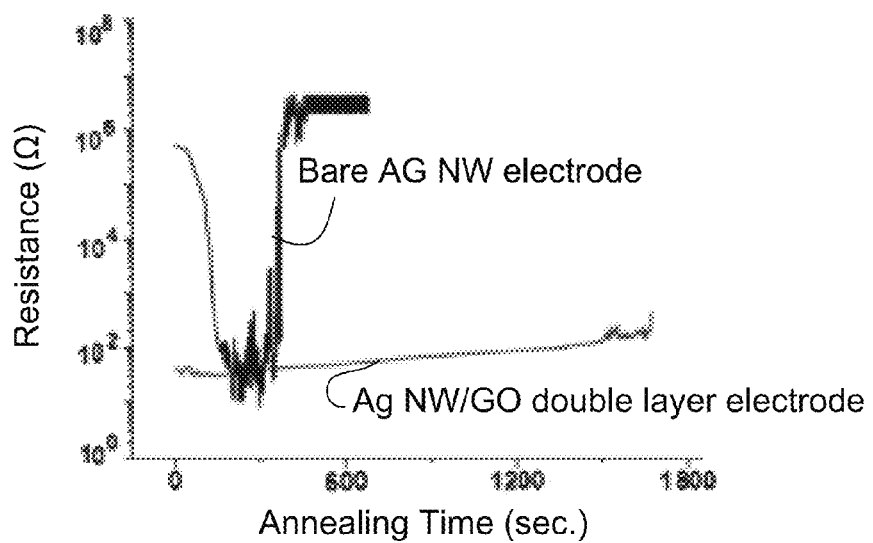
FIG. 7A is a graphical depiction showing electrical resistance changes of the bare Ag NW electrode as a function of annealing time, as applied to a nanowire/graphene oxide (NW/GO) double layer electrode during the sintering at 275° C.
Figure 7B:
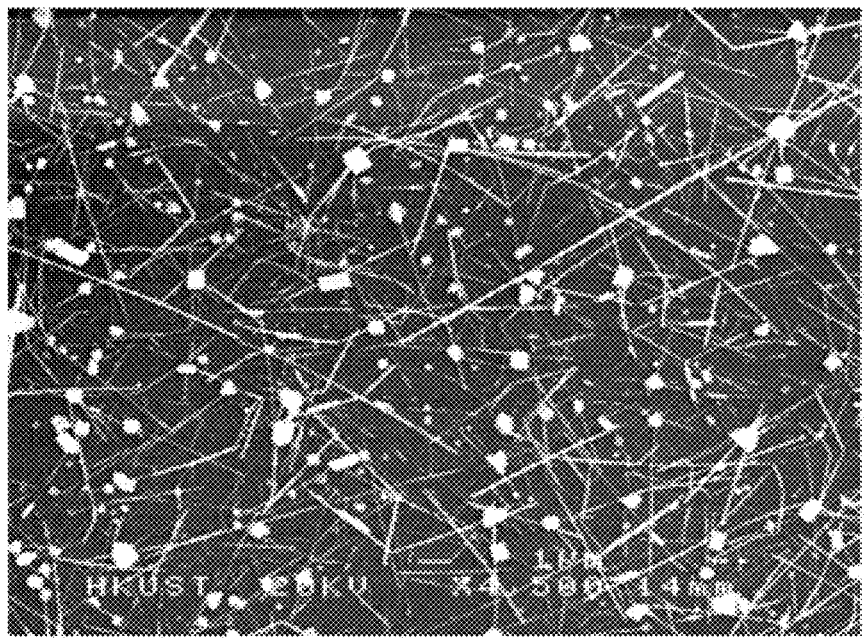
FIG. 7B is a SEM image of the bare Ag NW electrode after thermal treatment described by the graphical depiction of FIG. 7A.

FIG. 7A is a graphical depiction showing electrical resistance changes of the bare Ag NW electrode as a function of annealing time, as applied to an Ag NW/GO double layer electrode during the sintering at 275° C. FIG. 7B is a SEM image of the bare Ag NW electrode after thermal treatment at 275° C., as described by FIG. 7A. The thermal stability of Ag NW electrode is much poorer than traditional ITO glass (stable up to 400-500° C.). It is well known that Ag NW fuses at round 200° C. due to its size-dependent melting behaviors. FIG. 7A compares the thermal stability of bare Ag NW electrode with the double layer electrode. Both electrodes were sintered under 275° C. and the resistance was monitored with a multimeter. It can be seen that the resistance of the bare Ag NW film decreased down to few tens of $\Omega$ at the beginning 5 min due to the fusion of NWs. The film resistance sharply ramped up to $10^6\Omega$ and became insulating within 2 min after fusion process. It is shown that thermal stability of Ag NW is too poor. The SEM image of the bare NW film after heating shown in FIG. 7B shows that the NWs were broken due to the over-heating, resulting in the loss of percolation conductivity in the electrode. In contrary, the GO-coated NW film was found to be stable upon heating at 275° C. up to 25 min, indicating an improved thermal stability. It is expected that the enhanced thermal stability brought by the double layered structure would greatly expand the applications areas over that of Ag NW TCE.

Chemical stability is another important issue in metal NW based electrode. Although Ag is much more chemical stable than other metal NWs such as copper or nickel, it might undergo degradation during the device fabrication process or in the device working conditions. As a non-limiting example, $I^-/I^{3-}$ based electrolyte, which was widely used in most of the dye-sensitized solar cells (DSSC), can degrade the Ag NW electrode seriously. Thus a proper encapsulation top layer should be adopted to act as a protection layer for the Ag NW film and improve the chemical stability of the electrode.

Figure 8A:
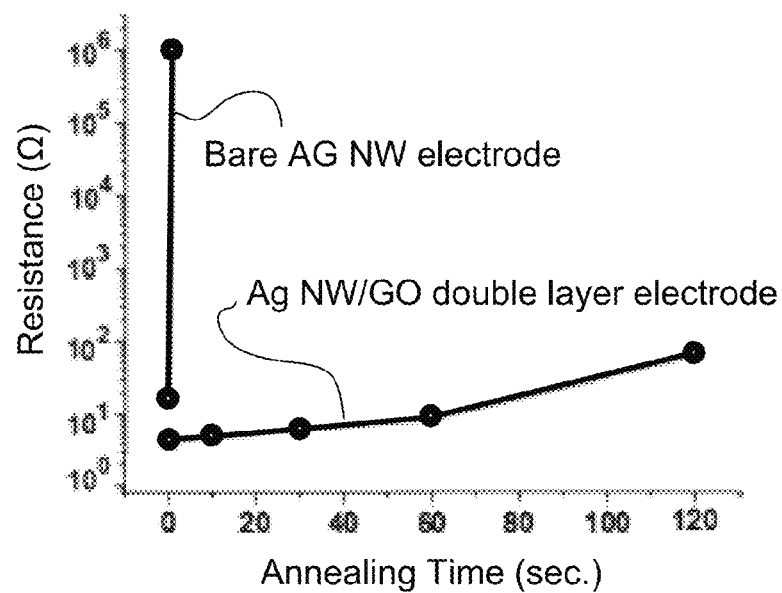
FIG. 8A is a graphical depiction showing electrical resistance changes of the bare Ag NW electrode and nanowire/graphene oxide (NW/GO) double layer electrode oxidized with iodine for different time periods.

To test whether the GO encapsulation layer could provide extra protection for the Ag NW, we tested samples by exposing them to iodine, which is one of the strongest oxidizers of Ag metal, to test the chemical stability of the Ag NW/GO double layered electrode. FIG. 8A is a graphical depiction showing electrical resistance changes of the bare Ag NW electrode and Ag NW/GO double layer electrode oxidized with iodine for different time periods.

Figure 8B:
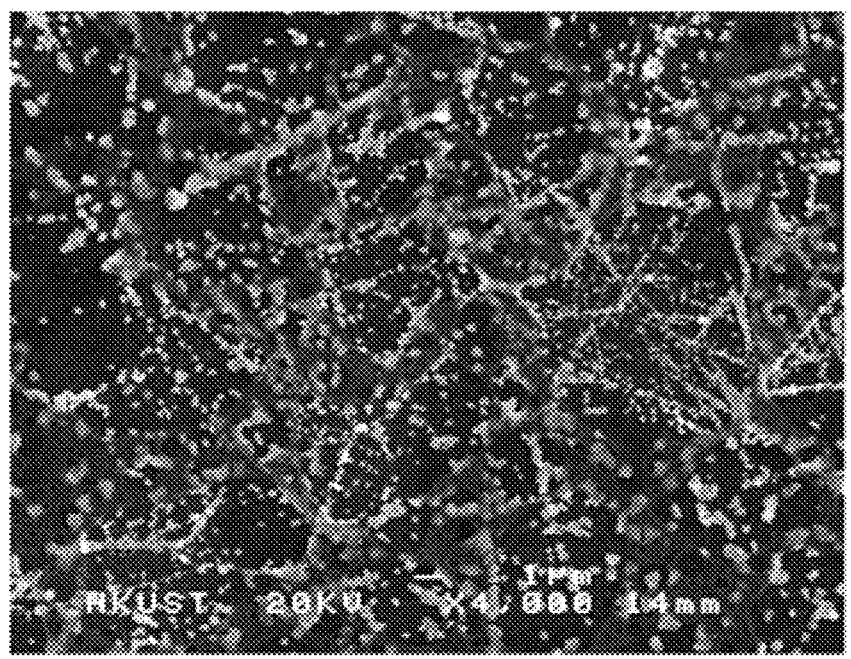
FIG. 8B is a SEM image of the bare Ag NW electrode after being oxidized with iodine, described by the graphical depiction of FIG. 8A.

FIG. 8B is a SEM image of the bare Ag NW electrode after being oxidized with iodine, as described by the graphical depiction of FIG. 8A. FIG. 8A shows the electrical resistance change of the bare Ag NW and the double layer electrode during the immersion of the electrode into the acetone solution of iodine for different time periods. The bare Ag NW electrode lost its conductivity within 1 second, which was expected, due to the strong oxidation ability of iodine to Ag. The SEM image in FIG. 8B is taken after exposing to iodine, indicating that the original Ag NWs were oxidized and converted into isolated nanoparticles. It was noted, however, that the resistance of the double layer electrode increased only slightly even up to 60 seconds. The result demonstrated the greatly improved chemical stability of double layer electrode due to the protection from the encapsulation layer.

CONCLUSION

Ag NW based transparent electrode is a potential candidate to replace ITO due to its excellent optoelectrical property. For incorporation of this transparent and conductive electrode into practical devices, the electrode needs to be resistant to chemical damage and heat. This will ensure that the electrode can survive the device manufacturing process and not limit long-term stability of the device. It is demonstrated that the GO coating not only maintains the optical transmittance of the Ag NW film but also enhances the film electrical conductivity. The thermal stability and chemical resistant were greatly enhanced due to the protection from the encapsulation layer. This double layer structured electrode might serve as an ultimate solution for the practical applications of Ag NW based transparent/flexible transparent conductive electrode.

It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A conductive thin film device comprising:
   a substrate;
   a thin film structure comprising a one-dimensional nanomaterial networked layer deposited on the substrate; and
   a single coating layer comprising a material selected from the group consisting of graphene oxide or graphene oxide in combination with a metal oxide sol gel film, the coating layer overlaying the one-dimensional nanomaterial networked layer as a top encapsulation layer, thereby providing the thin film structure with said top encapsulation layer, wherein
   the coating layer at least partially covers the nanomaterial networked layer, thereby forming the device as a double-layer structure without substantially deteriorating the performance of the thin film device in terms of light transmittance and electrical conductivity.

2. The conductive thin film device of claim 1, wherein the substrate comprises a material selected from the group consisting of polymer, ceramic, glass, semiconductor, metal, metal oxide, non-metal oxide and composite material surface.

3. The conductive thin film device of claim 1, wherein the substrate comprises an electronic device.

4. The conductive thin film device of claim 1, wherein
   the one-dimensional nanomaterial conductive layer comprises a one-dimensional nanostructure material, including metal nanowires selected from the group consisting of silver nanowires, gold nanowires, copper nanowires, metal oxide nanowires such as zinc oxide nanowires, titanium oxide nanotube, and carbon nanotube,
   wherein the thickness of the one-dimensional nanomaterial networked film ranges from 1 nm to 1 mm,
   and wherein the coating layer overlaying the one-dimensional nanomaterial networked layer ranges from 1 nm to 50 nm.

5. The conductive thin film device of claim 1, further comprising:
   the thin film provided as a thin film comprising a silver nanowire (Ag NW) network as a single layer structure of silver nanowire percolation network formed on the substrate.

6. The conductive thin film device of claim 1, wherein
   the one-dimensional nanomaterial conductive layer comprises a silver nanowire (Ag NW) network,
   wherein the coating layer comprises graphene oxide thin film overlaying on the one-dimensional nanostructure conductive layer,
   wherein the thickness of the one-dimensional nanomaterial networked film ranges from 1 nm to 1 mm,
   and wherein the graphene or graphene oxide coating ranges from 1 nm to 50 nm.

7. The conductive thin film device of claim 1, wherein
   the one-dimensional nanomaterial conductive layer provides a one-dimensional nanostructure material comprising carbon nanotubes, graphene oxide or graphene oxide in combination with a metal oxide sol gel film coating layer overlaying on the one-dimensional nanostructure conductive layer,
   wherein the thickness of the one-dimensional nanomaterial networked film ranges from 1 nm to 1 mm,
   and wherein the graphene or graphene oxide coating ranges from 1 nm to 50 nm.

8. The conductive thin film device of claim 1, wherein the coating layer comprises graphene oxide or graphene oxide in combination with a metal oxide sol gel thin film overlaying on the one-dimensional nanostructure conductive layer, and wherein the thickness of the coating layer ranges from 1 nm to 50 nm.

9. The conductive thin film device of claim 1, wherein the coating layer enhances the conductivity of the thin film device.

10. The conductive thin film device of claim 1, further comprising:
    the nanomaterial networked comprising a nanowire conductive layer; and
    the coating layer comprising dissolved graphene oxide or graphene oxide in combination with a metal oxide sol gel thin film on top of at least a portion of the nanowire conducting layer applied by permitting a solvent to evaporate, thereby forming the graphene or graphene oxide layer on top of at least a portion of the nanowire conductive layer.

11. The conductive thin film device of claim 1, wherein the conductive thin film forms a thermal interface material, thin film electrode, flexible electrode or a transparent electrode.

12. The conductive thin film device of claim 1, further comprising:
    the substrate formed as a transparent substrate; and
    thin film structure comprising a one-dimensional nanomaterial networked layer deposited on the substrate and a coating layer overlaying the one-dimensional nanomaterial networked layer, wherein
    the conductive thin film forms a thermal interface material, thin film electrode, flexible electrode or a transparent electrode.

13. The conductive thin film device of claim 12, wherein the thin film device exhibits a transmittance ranging from 50% to 99%.

14. A method of forming a double-layer structured electrode as a one-dimensional nanomaterial network, the method comprising:
    providing a substrate;
    applying a first layer as a thin film comprising a metal or metal oxide network as a one-dimensional nanomaterial networked layer; and
    applying a single top coating over the metal or metal oxide network, the top coating comprising a material selected from graphene oxide or graphene oxide in combination with a metal oxide sol gel film, thereby forming a 2D surface structure, the coating layer overlaying the one-dimensional nanomaterial networked layer as a top encapsulation layer, thereby providing the thin film structure having a top encapsulation layer and forming the device as a double-layer structure without substantially deteriorating the performance of the thin film device in terms of light transmittance and electrical conductivity.

15. The method of claim 14, further comprising:
applying the first layer as a thin film comprising a silver nanowire (Ag NW) network as a single layer structure of silver nanowire percolation network formed on the substrate.

16. The method of claim 15, further comprising:
forming the first layer by coating the transparent substrate with a layer of Ag NW via drop-casting of an alcohol suspension; and
applying the top coating as a graphene oxide layer, by spin-coating a suspension of graphene oxide on the first layer.

17. The method of claim 15, further comprising:
providing the substrate as a transparent substrate;
forming the first layer by coating the transparent substrate with a layer of Ag NW via drop-casting of an alcohol suspension; and
applying the top coating as a graphene oxide layer, by spin-coating a suspension of graphene oxide on the first layer.

18. The method of claim 14, further comprising:
providing the substrate as a material selected from the group consisting of polymer, ceramic, glass, semiconductor, metal, metal oxide, non-metal oxide and composite material surface.

19. The method of claim 14, further comprising:
providing the substrate as a material selected from the group consisting of polymer, ceramic, glass, semiconductor, metal, metal oxide, non-metal oxide and composite material surface; and
the substrate comprising an electronic device.

20. The method of claim 14, further comprising:
using, as the nanomaterial networked layer, a nanowire conductive layer;
applying the coating layer by using a solvent applying solution comprising dissolved graphene oxide or graphene oxide in combination with a metal oxide sol gel thin film; and
permitting the solvent to evaporate, thereby forming the graphene or graphene oxide layer on top of at least a portion of the nanowire conductive layer.

21. A method of forming a double-layer structured electrode as a one-dimensional nanomaterial network, the method comprising:
providing a transparent substrate;
applying a first layer by coating the transparent substrate with a single thin film layer comprising a silver nanowire (Ag NW) network as a single layer structure of silver nanowire percolation network formed on the substrate via drop-casting of an alcohol suspension applied as a thin film comprising a metal or metal oxide network as a one-dimensional nanomaterial networked layer; and
applying a single top coating over the metal or metal oxide network, the top coating comprising a material selected from graphene oxide or graphene oxide in combination with a metal oxide sol gel film, thereby forming a 2D surface structure, by spin-coating a suspension of graphene oxide to provide a graphene oxide layer thickness in the range of from 1 nm to 50 nm.

\* \* \* \* \*